US008908371B2

(12) United States Patent
Ariga

(10) Patent No.: US 8,908,371 B2
(45) Date of Patent: Dec. 9, 2014

(54) TELEVISION AND ELECTRONIC APPARATUS

(71) Applicant: Kabushiki Kaisha Toshiba, Minato-ku, Tokyo (JP)

(72) Inventor: Koji Ariga, Ome (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 10 days.

(21) Appl. No.: 13/715,337

(22) Filed: Dec. 14, 2012

(65) Prior Publication Data

US 2013/0235541 A1 Sep. 12, 2013

(30) Foreign Application Priority Data

Mar. 9, 2012 (JP) ................................. 2012-053612

(51) Int. Cl.
*H01R 13/73* (2006.01)
*H02B 1/01* (2006.01)
*H05K 5/00* (2006.01)

(52) U.S. Cl.
CPC ..................................... *H05K 5/0026* (2013.01)
USPC ........................................ 361/679.55; 439/544

(58) Field of Classification Search
None
See application file for complete search history.

(56) References Cited

U.S. PATENT DOCUMENTS

| | | | | |
|---|---|---|---|---|
| 4,676,575 A * | 6/1987 | Denlinger et al. | ............ | 439/271 |
| 5,331,509 A * | 7/1994 | Kikinis | ................... | 361/679.37 |
| 7,094,099 B2 * | 8/2006 | Daggett et al. | ................ | 439/567 |
| 7,175,443 B2 | 2/2007 | Mizuno et al. | | |
| 7,192,305 B2 * | 3/2007 | Kato et al. | ..................... | 439/544 |
| 7,364,473 B2 * | 4/2008 | Ohta | .............................. | 439/694 |
| 7,495,895 B2 * | 2/2009 | Carnevali | ................. | 361/679.26 |
| 8,182,284 B2 * | 5/2012 | Kuo | .............................. | 439/545 |
| 8,294,037 B2 * | 10/2012 | Ondelj | ........................... | 174/260 |
| 8,437,130 B2 * | 5/2013 | Hoshi et al. | ............. | 361/679.55 |
| 2003/0220009 A1 | 11/2003 | Takeguchi et al. | | |
| 2004/0075977 A1 * | 4/2004 | Lee | ............................... | 361/684 |
| 2004/0092139 A1 * | 5/2004 | Merz | ............................. | 439/76.1 |
| 2005/0206794 A1 * | 9/2005 | Tokuda | ......................... | 348/836 |
| 2006/0187629 A1 * | 8/2006 | Emery et al. | ................. | 361/684 |
| 2007/0167059 A1 * | 7/2007 | Merz | ............................. | 439/310 |
| 2007/0177114 A1 * | 8/2007 | Shirakura | ..................... | 353/119 |
| 2007/0247803 A1 * | 10/2007 | Eickholdt | ..................... | 361/685 |
| 2008/0007670 A1 * | 1/2008 | Zhang | ............................. | 349/58 |
| 2008/0020633 A1 * | 1/2008 | Montgomery et al. | ....... | 439/544 |
| 2008/0204992 A1 * | 8/2008 | Swenson et al. | ............. | 361/684 |

(Continued)

FOREIGN PATENT DOCUMENTS

JP 2001-266993 9/2001
JP 2003-345464 12/2003

(Continued)

OTHER PUBLICATIONS

Japanese Office Action for Japanese Application No. 2012-053612, mailed Apr. 2, 2013, in 5 pages.

*Primary Examiner* — Adrian S Wilson
(74) *Attorney, Agent, or Firm* — Knobbe, Martens, Olson & Bear LLP

(57) ABSTRACT

According to one embodiment, an electronic apparatus is configured to receive a first connector. The first connector includes an insulator and a metal portion protruding from the insulator. The apparatus includes a housing and a second connector in the housing. The second connector is configured to engage with the metal portion of the first connector. The housing includes a portion configured to face a part of the insulator in a direction intersecting an insertion direction of the first connector.

18 Claims, 19 Drawing Sheets

(56) References Cited

U.S. PATENT DOCUMENTS

| | | | |
|---|---|---|---|
| 2008/0307840 A1* | 12/2008 | Yu et al. | 70/393 |
| 2010/0003849 A1* | 1/2010 | Murakami | 439/527 |
| 2010/0068922 A1* | 3/2010 | Zhou et al. | 439/527 |
| 2011/0104945 A1* | 5/2011 | Gao et al. | 439/607.01 |
| 2011/0122557 A1* | 5/2011 | Takeguchi et al. | 361/679.01 |
| 2012/0224299 A1* | 9/2012 | Myers et al. | 361/679.01 |
| 2013/0084736 A1* | 4/2013 | Strittmatter et al. | 439/544 |

FOREIGN PATENT DOCUMENTS

| | | |
|---|---|---|
| JP | 2005-191253 | 7/2005 |
| JP | 2006-032288 | 2/2006 |
| JP | 2006-164712 | 6/2006 |

* cited by examiner

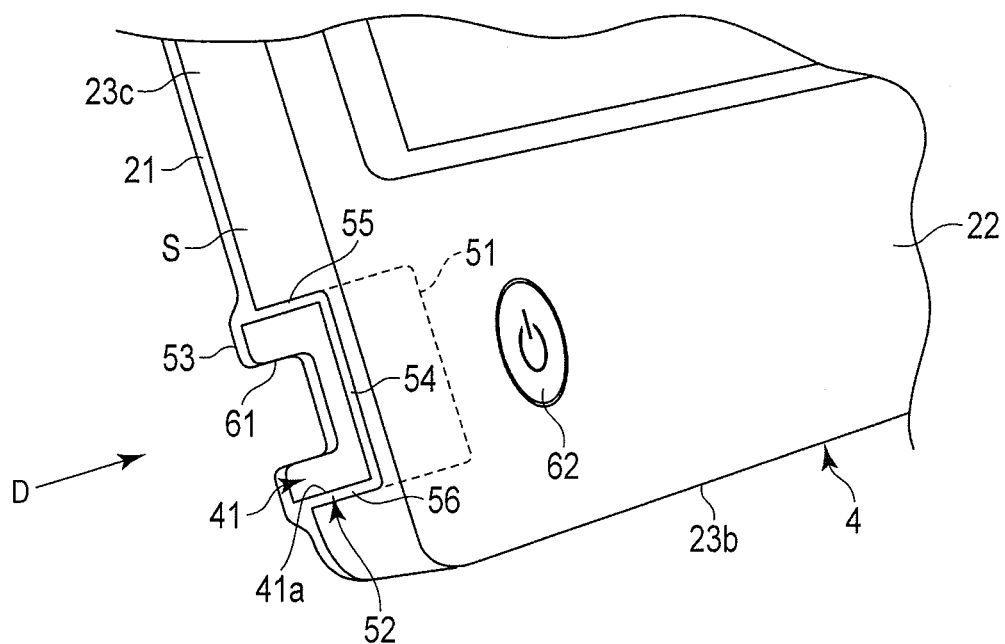
F I G. 11

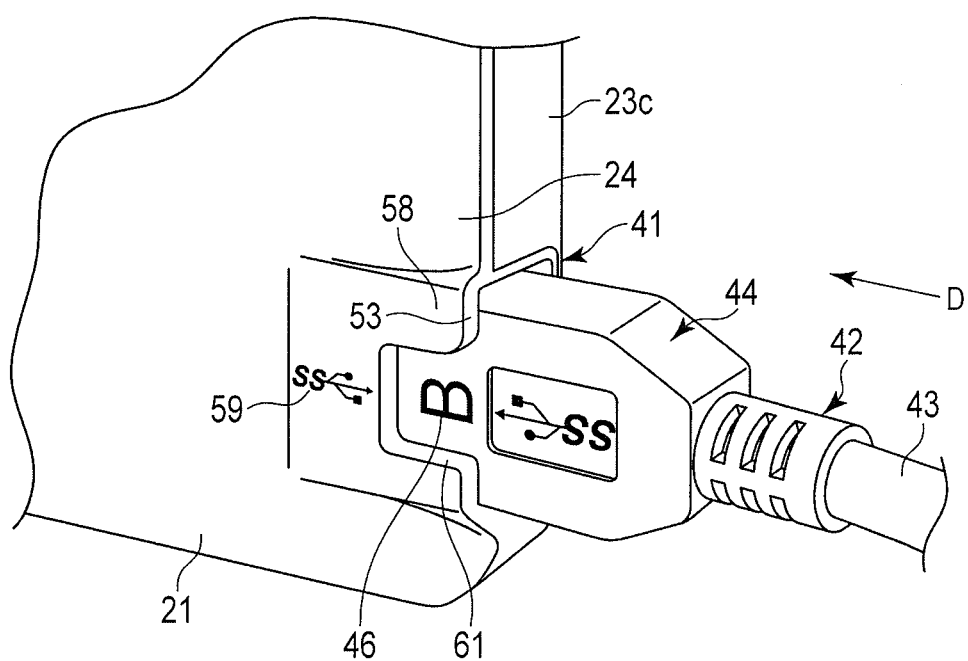
F I G. 15

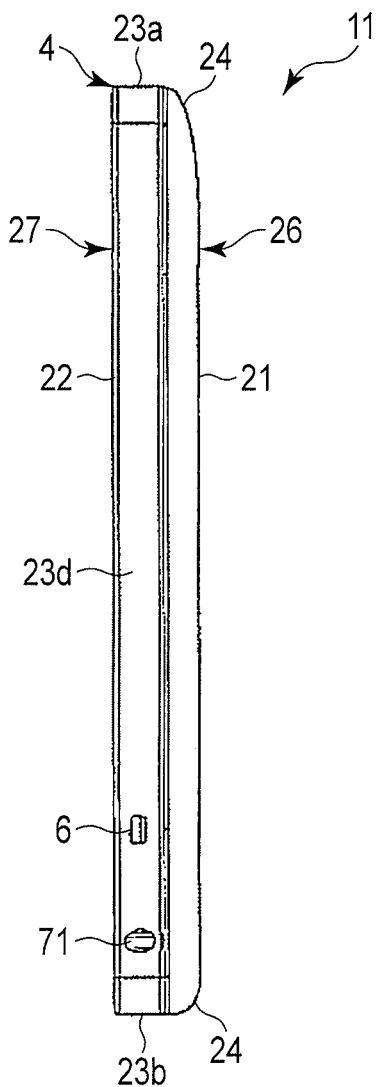
F I G. 16

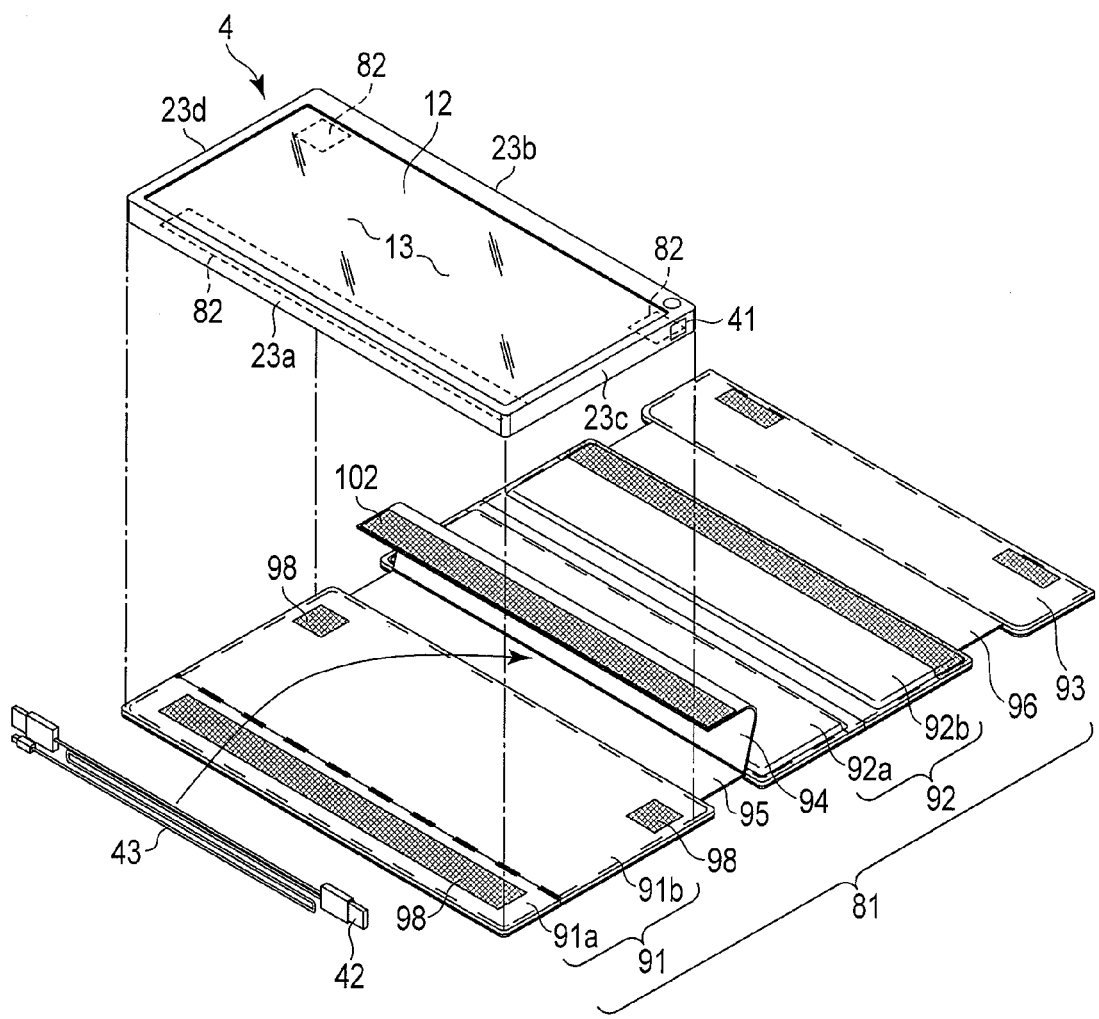
F I G. 18

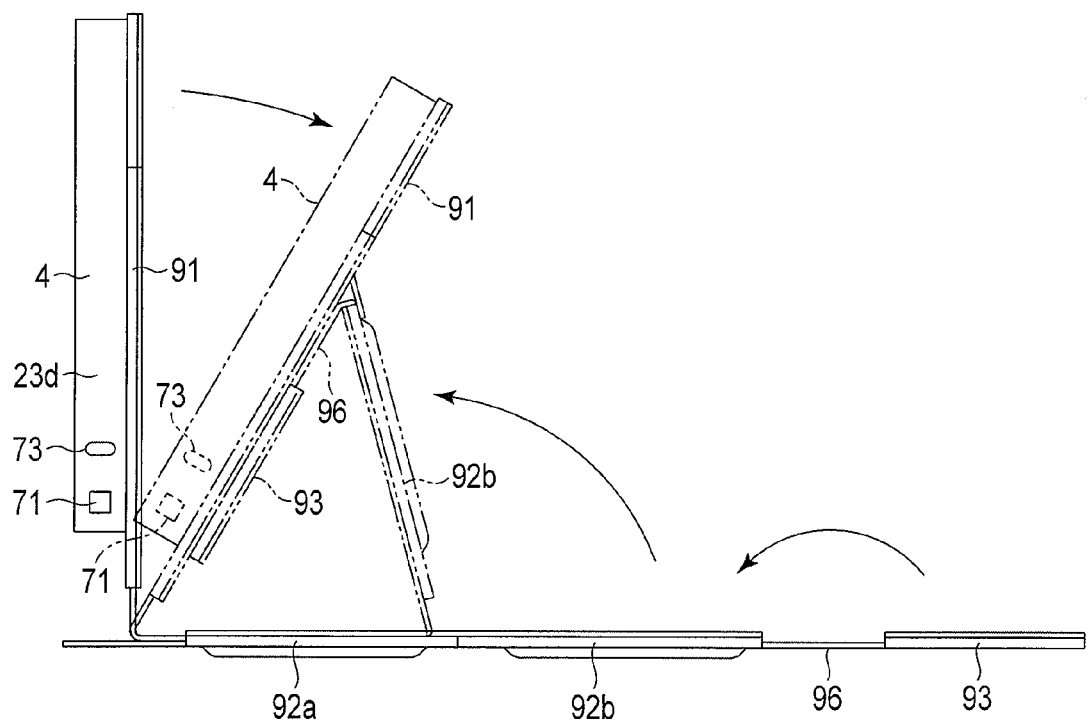
F I G. 21

TELEVISION AND ELECTRONIC APPARATUS

CROSS-REFERENCE TO RELATED APPLICATIONS

This application is based upon and claims the benefit of priority from prior Japanese Patent Application No. 2012-053612, filed Mar. 9, 2012; the entire contents of which are incorporated herein by reference.

FIELD

Embodiments described herein relate generally to electronic apparatuses including televisions and vehicles.

BACKGROUND

An electronic apparatus including a connector has been provided.

BRIEF DESCRIPTION OF THE DRAWINGS

A general architecture that implements the various features of the embodiments will now be described with reference to the drawings. The drawings and the associated descriptions are provided to illustrate the embodiments and not to limit the scope of the invention.

FIG. 11 is an exemplary perspective view illustrating a recess illustrated in FIG. 10;

FIG. 15 is an exemplary perspective view illustrating the recess illustrated in FIG. 10;

FIG. 16 is an exemplary side view illustrating a second side wall of the electronic apparatus illustrated in FIG. 2;

FIG. 18 is an exemplary perspective view illustrating a cover to which a housing illustrated in FIG. 2 is attached;

FIG. 21 is an exemplary side view illustrating the deformation of the cover illustrated in FIG. 18.

DETAILED DESCRIPTION

Various embodiments will be described hereinafter with reference to the accompanying drawings.

In general, according to one embodiment, an electronic apparatus is configured to receive a first connector. The first connector comprises an insulator and a metal portion protruding from the insulator. The apparatus comprises a housing and a second connector in the housing. The second connector is configured to engage with the metal portion of the first connector. The housing comprises a portion configured to face a part of the insulator in a direction intersecting an insertion direction of the first connector.

Hereinafter, exemplary embodiments of the invention will be described with reference to the accompanying drawings. In the specification, the near side (i.e., user side) is defined as the front direction, the far side as viewed from the user is defined as the rear direction, the left side as viewed from the user is defined as the left direction, the right side as viewed from the user is defined as the right direction, the upper side as viewed from the user is defined as the upper direction, and the lower side as viewed from the user is defined as the lower direction.

In this specification, some components which may be expressed by a plurality of terms are expressed by two or more terms. Those terms are examples. Those components may be further expressed by another or other terms. And the other components which are not expressed by two or more terms may be expressed by another or other terms.

(First Embodiment)

Figure 1:
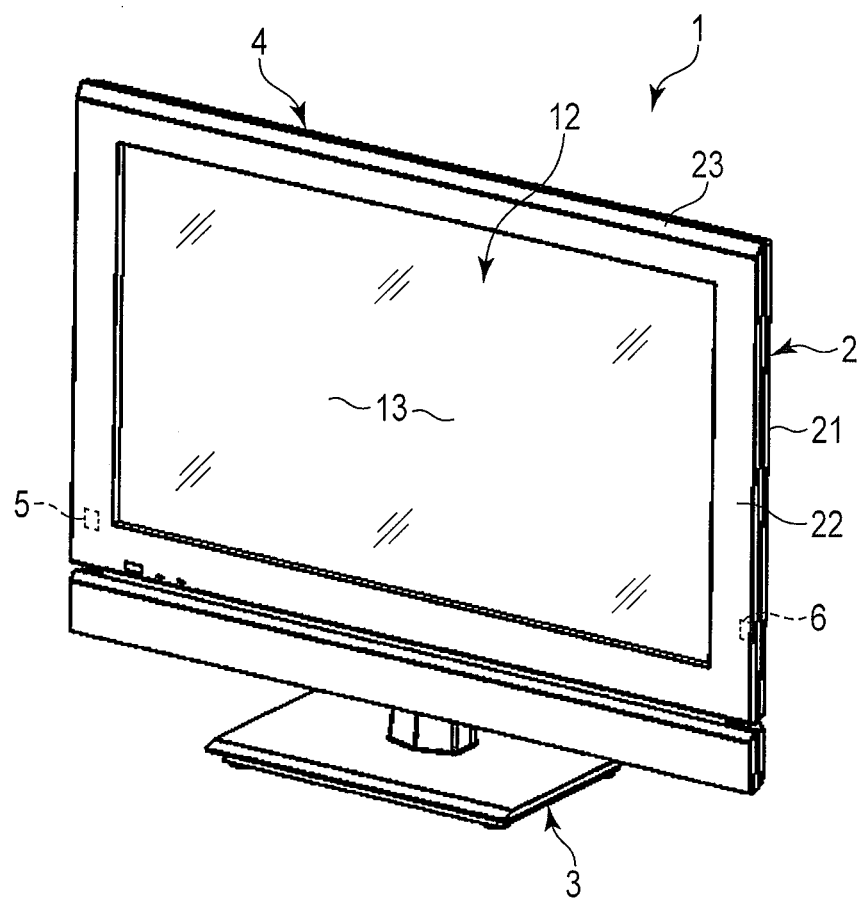
FIG. 1 is an exemplary perspective view illustrating a television according to a first embodiment.

FIG. 1 illustrates a television 1 according to a first embodiment. The television 1 is an example of an "electronic apparatus". The television 1 includes a display unit 2' and a stand 3 (i.e., supporting portion) which supports the display unit 2. The display unit 2 includes a housing 4. The housing 4 includes a connector 5 and a security lock attachment portion 6.

These components have substantially the same structures as those in a second embodiment. Therefore, the second embodiment will be described in detail. Components having the same or similar functions as those in the second embodiment are denoted by the same reference numerals.

(Second Embodiment)

Next, an electronic apparatus 11 according to the second embodiment will be described with reference to FIGS. 2 to 21. The electronic apparatus 11 according to this embodiment is, for example, a portable monitor. The electronic apparatus to which the structures according to this embodiment and the following embodiments can be applied is not limited to the portable monitor. All of the embodiments and modifications described in the specification can be widely applied to various electronic apparatuses, such as notebook portable computers (i.e., notebook PCs), slate portable computers (i.e., slate PCs or tablets), televisions, mobile phones (including smart phones), and game machines.

Figure 2:
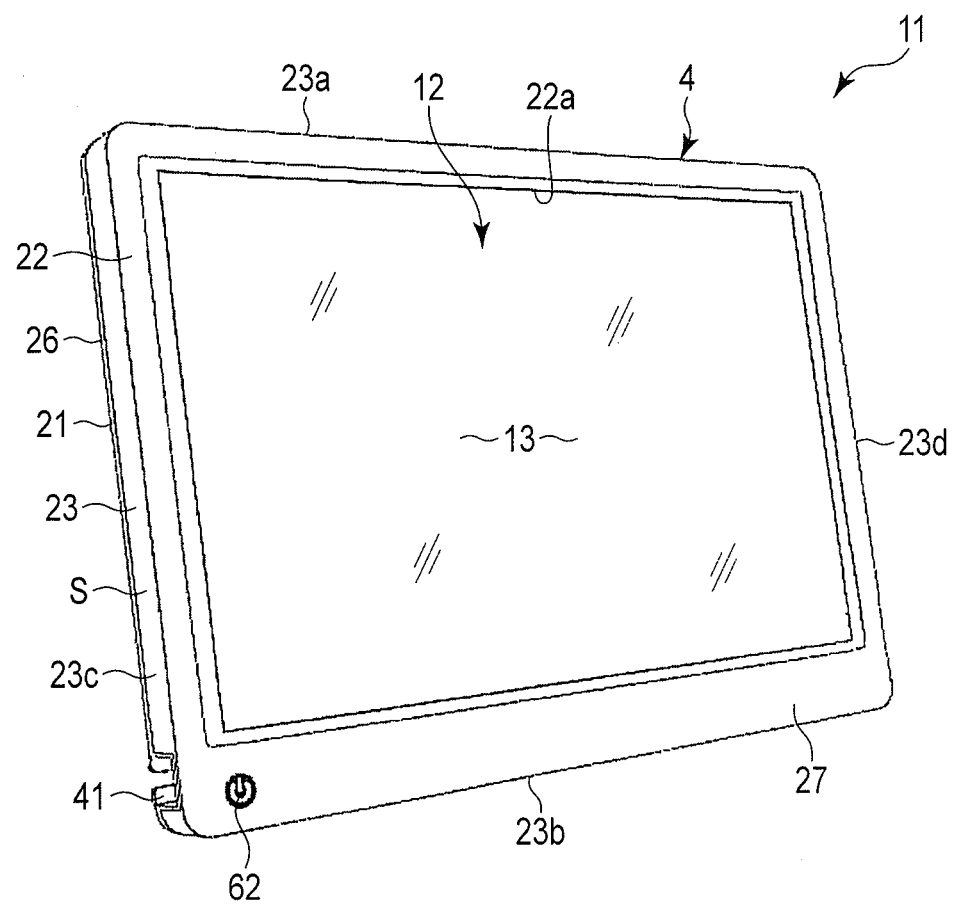
FIG. 2 is an exemplary perspective view illustrating an electronic apparatus according to a second embodiment.
Figure 3:
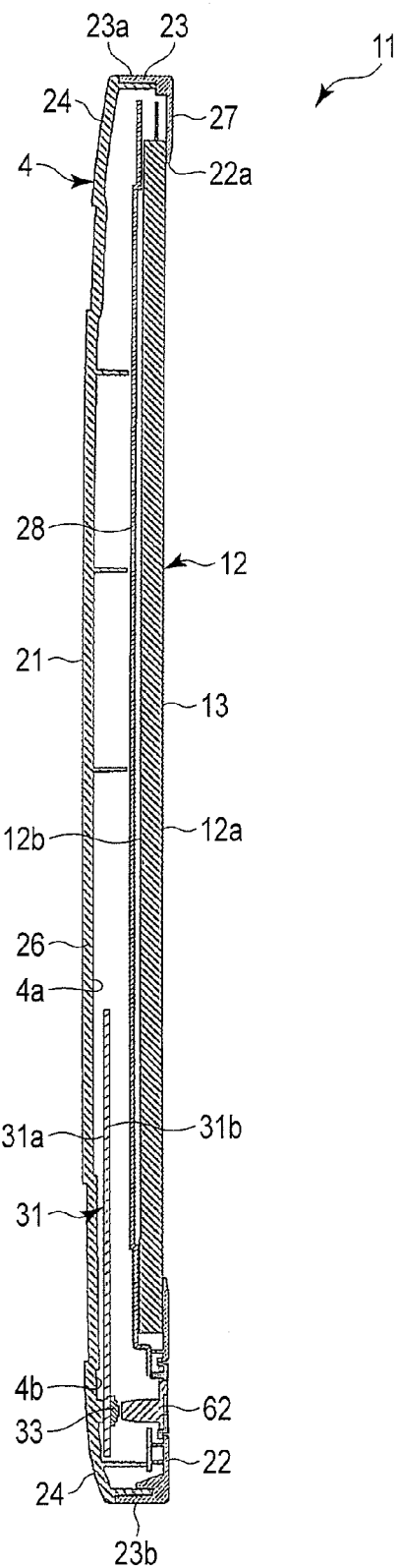
FIG. 3 is an exemplary cross-sectional view illustrating the electronic apparatus illustrated in FIG. 2.

As illustrated in FIGS. 2 and 3, the electronic apparatus 11 includes a housing 4 and a display device 12 accommodated in the housing 4. The display device 12 includes a first surface 12a (e.g., display surface) including a display screen 13 and a second surface 12b (e.g., rear surface) opposite the first surface 12a. A touch sensor (i.e., touch panel) is provided on the first surface 12a. The touch sensor is an example of an input unit (i.e., an input receiving unit or an operation unit).

The housing 4 includes a rear wall 21 (i.e., a back wall, a first wall, or a first surface), a front wall 22 (i.e., a second wall or a second surface), and a circumferential wall 23 (i.e., a side wall, a third wall, or a third surface). The rear wall 21 extends substantially in parallel to (i.e., is spread substantially in parallel to) the display device 12. The rear wall 21 faces the second surface 12b of the display device 12. The end of the rear wall 21 includes a curved surface portion 24 which is curved in a direction in which the thickness of the housing 4 is reduced.

The front wall 22 is opposite to the rear wall 21. The front wall 22 extends substantially in parallel to (i.e., is spread substantially in parallel to) the rear wall 21. The front wall 22 faces the first surface 12a of the display device 12. That is, the display device 12 is disposed between the rear wall 21 and the front wall 22. An opening 22a through which the display screen 13 is exposed is provided in the front wall 22.

The circumferential wall 23 extends in a direction intersecting (e.g., substantially perpendicular to) the rear wall 21 and the front wall 22. The circumferential wall 23 extends in the thickness direction of the housing 4 between the end (e.g., circumferential end or edge) of the front wall 22 and the end (e.g., circumferential end or edge) of the rear wall 21. The thickness direction of the housing 4 is a direction from the rear wall 21 to the front wall 22 (or from the front wall 22 to the rear wall 21).

The circumferential wall 23 includes an upper wall 23a (i.e., upper surface), a lower wall 23b (i.e., lower surface), a first side wall 23c (i.e., a first side surface, e.g., a left wall), and a second side wall 23d (i.e., a second side surface, e.g., example, a right wall). The upper wall 23a and the lower wall 23b extend in the longitudinal direction of the housing 4. The first side wall 23c and the second side wall 23d extend in a direction intersecting (e.g., substantially perpendicular to) the upper wall 23a and the lower wall 23b. The first side wall 23c and the second side wall 23d extend in the lateral direction of the housing 4. The first side wall 23c and the second side wall 23d may be reversed in the left-right direction.

Figure 4:
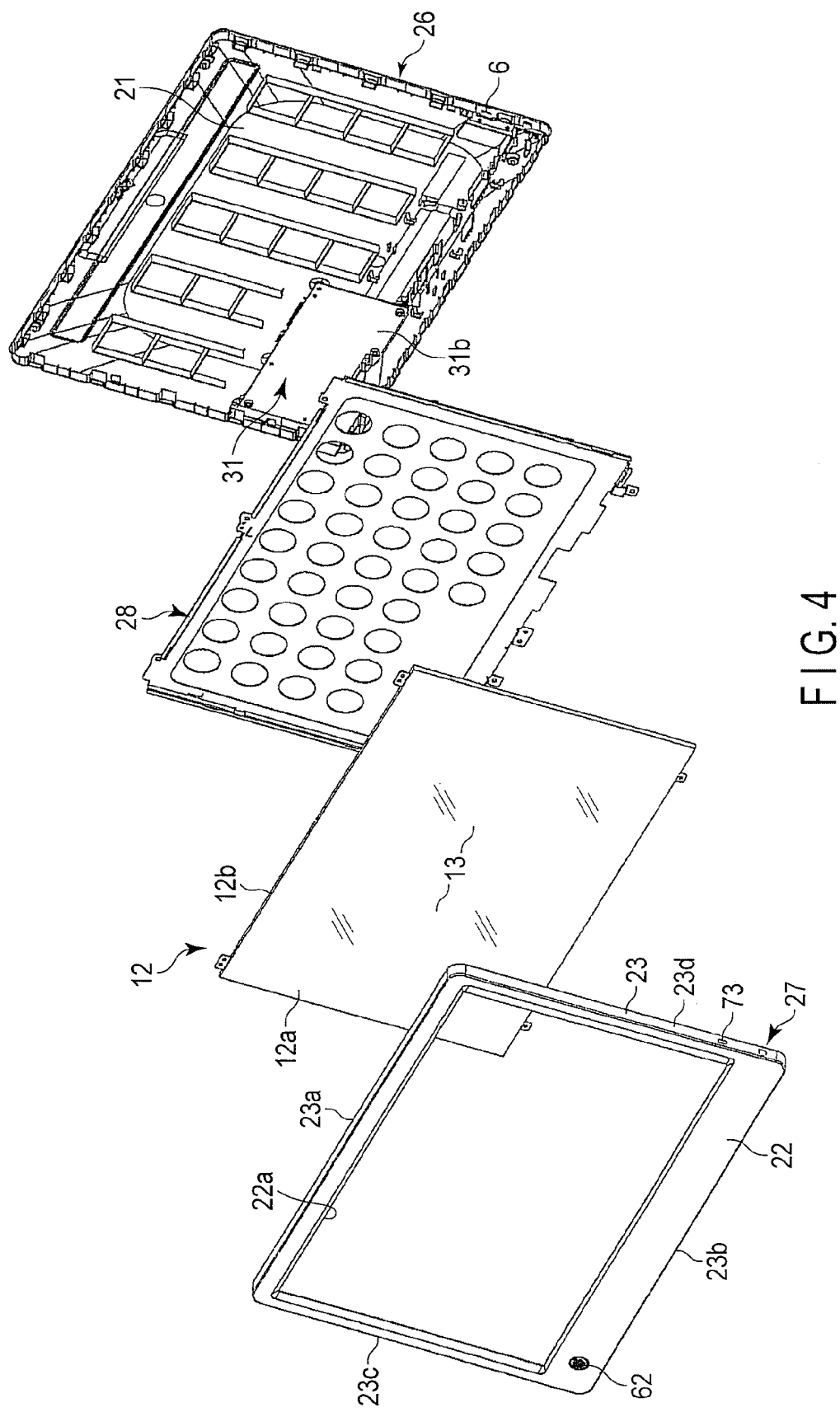
FIG. 4 is an exemplary exploded perspective view illustrating the electronic apparatus illustrated in FIG. 2.

As illustrated in FIGS. 3 and 4, the housing 4 includes a first cover 26 (i.e., a bottom cover, a base, a first member, or a first portion) and a second cover 27 (i.e., a front cover, a mask, a second member, or a second portion). In this embodiment, the first cover 26 includes the rear wall 21. The second cover 27 includes the front wall 22 and the circumferential wall 23. The first cover 26 and the second cover 27 are combined with each other to form the housing 4.

As illustrated in FIGS. 3 and 4, the housing 4 includes a middle plate 28 (i.e., a middle frame, a supporting portion, a holding portion, a reinforcing member, a reinforcing portion, or a third member). The middle plate 28 is disposed between the display device 12 and the rear wall 21. The middle plate 28 is made of a metal material and has relatively high rigidity. The middle plate 28 is fixed to the rear wall 21 and reinforces the housing 4.

A circuit board 31 is provided in the housing 4. The circuit board 31 is disposed between the middle plate 28 and the rear wall 21. That is, the circuit board 31 is disposed between the display device 12 and the rear wall 21. The circuit board 31 extends substantially in parallel to (i.e., is spread substantially in parallel to) the rear wall 21. The circuit board 31 includes a first surface 31a and a second surface 31b. The first surface 31a faces the rear wall 21. The circuit board 31 is fixed to the rear wall 21. The second surface 31b faces the display device 12 (i.e., faces front wall 22).

As illustrated in FIGS. 3 to 6, in this embodiment, a portion of the circuit board 31 and a portion of the display device 12 overlap each other in the thickness direction of the housing 4. In this way, it is possible to reduce an area required to mount the circuit board 31. That is, it is possible to reduce the size of the housing 4 and provide the electronic apparatus 11 with a narrow frame.

Figure 6:
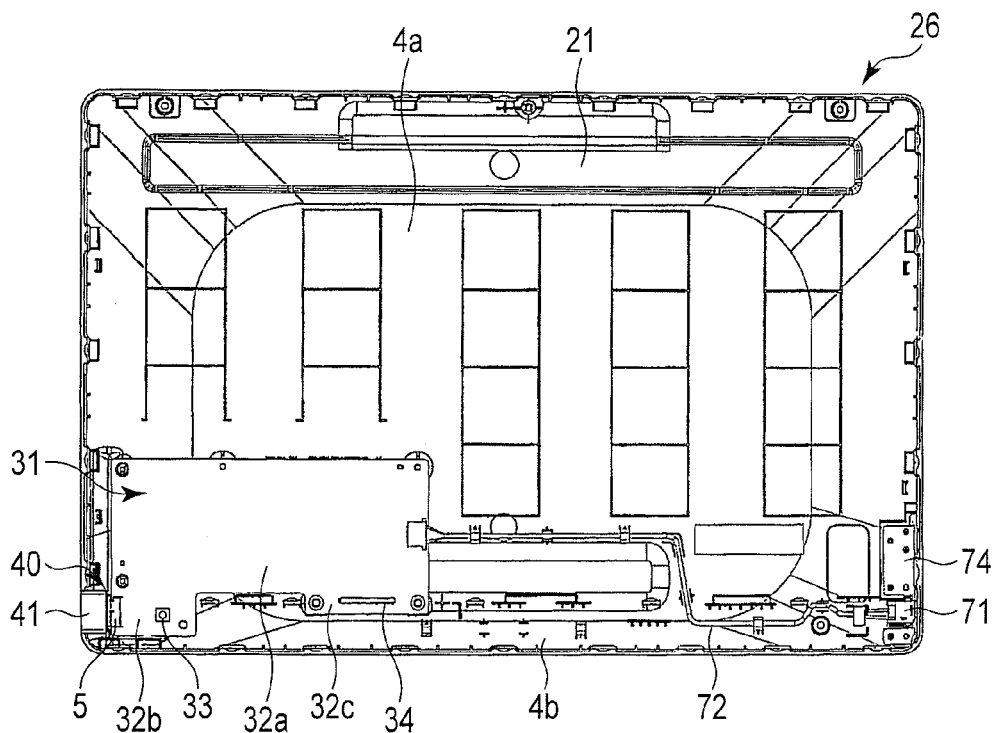
FIG. 6 is an exemplary plan view illustrating the internal structure of the electronic apparatus illustrated in FIG. 2.

As illustrated in FIG. 6, the circuit board 31 is provided at the corner of the housing 4. The circuit board 31 includes a first portion 32a (i.e., first region), a second portion 32b (i.e., second region), and a third portion 32c (i.e., third region).

The first portion 32a extends in the longitudinal direction of the housing 4. The first portion 32a includes a first end (e.g., a left end) in the longitudinal direction and a second end (e.g., right end) opposite to the first end. The second portion 32b (e.g., first protruding portion) protrudes from the first end of the first portion 32a in the lateral direction of the housing 4. The third portion 32c (e.g., second protruding portion) protrudes from the second end of the first portion 32a in the lateral direction of the housing 4.

Figure 5:
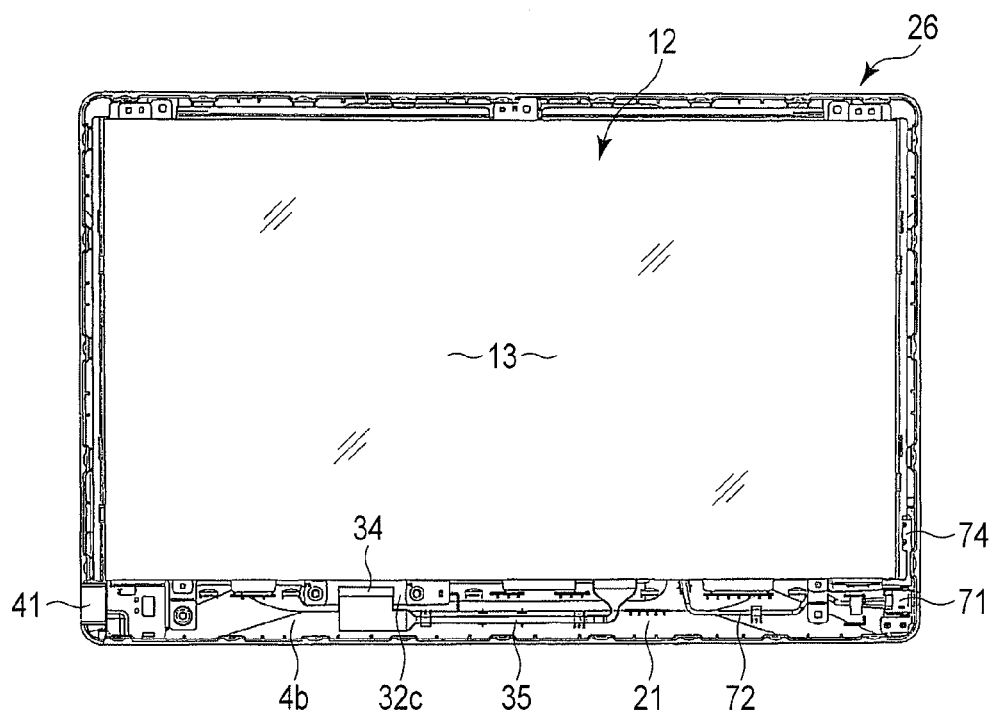
FIG. 5 is an exemplary plan view illustrating the internal structure of the electronic apparatus illustrated in FIG. 2.
Figure 7:
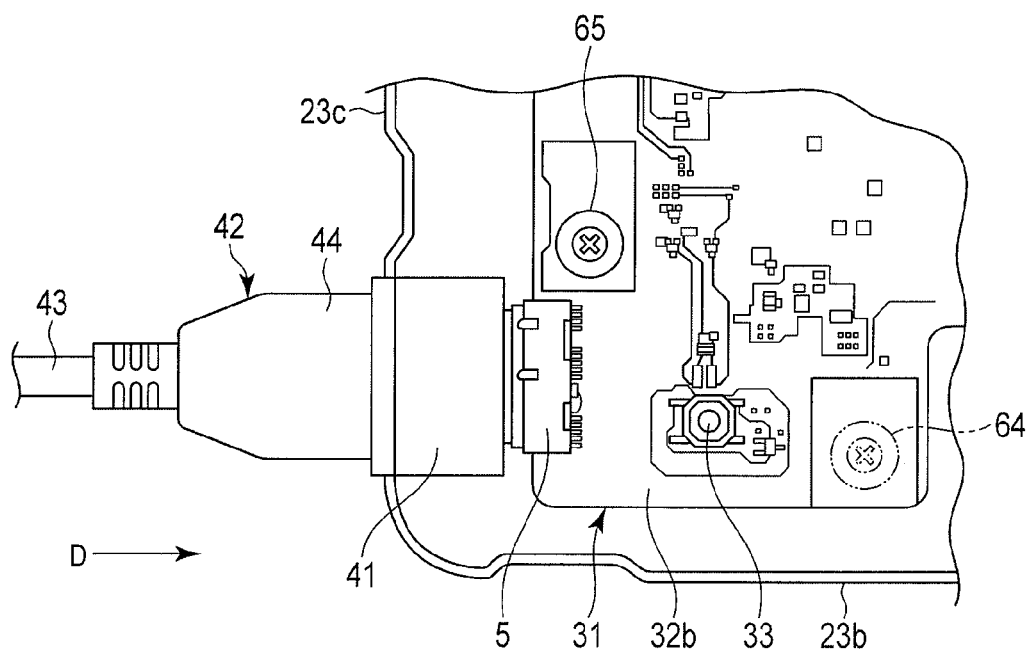
FIG. 7 is an exemplary enlarged plan view illustrating the vicinity of a connector illustrated in FIG. 6.

As illustrated in FIGS. 6 and 7, a connector 5 and a switch 33 are mounted in the second portion 32b. The connector 5 and the switch 33 will be described in detail below. A connector 34 is mounted in the third portion 32c. As illustrated in FIG. 5, a cable 35 connected to the display device 12 is connected to the connector 34. The circuit board 31 is electrically connected to the display device 12 through the connector 34 and the cable 35.

As illustrated in FIGS. 5 and 6, the housing 4 includes a first region 4a which overlaps the display device 12 and a second region 4b which does not overlap the display device 12 in the thickness direction of the housing 4. The connector 5 and the switch 33 are provided in the second region 4b. In other words, the connector 5 and the switch 33 are disposed between the display device 12 and the circumferential wall 23 (e.g., the lower wall 23b).

(Connector Attachment Structure)

First, a connector attachment structure 40 (i.e., a connector mounting structure, a connector accommodating structure, or a connector fixing structure) according to this embodiment will be described. The connector attachment structure 40 includes the connector 5 and a recess 41, which will be described below. As illustrated in FIG. 7, for example, a plug 42, which is an external member, is to be connected to the connector 5.

Figure 8:
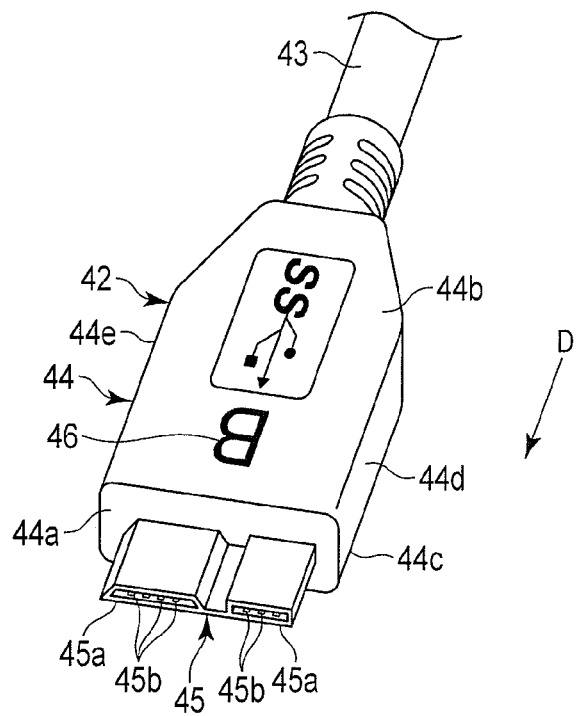
FIG. 8 is an exemplary perspective view illustrating a plug fitted to the connector illustrated in FIG. 7.

FIG. 8 illustrates an example of the plug 42 (i.e., a first connector, a male connector, a male portion, an external member, a first connection portion, a first conductive portion, a first member, or a first portion) according to this embodiment. The plug 42 according to this embodiment is a standard product (i.e., general-purpose product). The plug 42 is, for example, a USB plug which is provided at the end of the cable 43. The plug 42 according to this embodiment is a USB3.0 micro-B plug.

As illustrated in FIG. 8, the plug 42 includes a supporting portion 44 (i.e., supporter, insulator, a resin portion, a mold portion, a non-metal portion, a non-conductive portion, a case, a protective portion, or a holding portion) made of a resin and a terminal 45 (a metal portion or a conductive portion) made of a metal. The supporting portion 44 has, for example, a flat box shape and includes first to fifth surfaces 44a, 44b, 44c, 44d, and 44e.

The first surface 44a is an end surface (e.g., leading end surface) which is provided at the leading end of the supporting portion 44. The first surface 44a extends in a direction intersecting (e.g., substantially perpendicular to) the insertion direction D of the plug 42. The first surface 44a faces the connector 5 in the insertion direction D of the plug 42.

The second to fifth surfaces 44b, 44c, 44d, and 44e extend in the insertion direction D of the plug 42. That is, the second to fifth surfaces 44b, 44c, 44d, and 44e extend in a direction intersecting (e.g., substantially perpendicular to) the first surface 44a. The second to fifth surfaces 44b, 44c, 44d, and 44e form the circumferential surface (e.g., side surface, or outer circumferential surface) of the supporting portion 44.

The third surface 44c is opposite to the second surface 44b. The fourth surface 44d and the fifth surface 44e extend in a direction intersecting (e.g., substantially perpendicular to) the second surface 44b and the third surface 44c. The fifth surface 44e is opposite to the fourth surface 44d.

The second surface 44b includes a marked portion 46 (e.g., display portion) having, for example, marks or characters. The marked portion 46 includes, for example, a logo mark indicating the type of plug 42. In this embodiment, the marked portion 46 includes a logo mark indicating a USB3.0 micro-B plug.

The terminal 45 protrudes from substantially the center of the first surface 44a of the supporting portion 44 in the insertion direction of the plug 42. The terminal 45 includes a first portion 45a (i.e., first terminal) and a plurality of second portions 45b (i.e., second terminals). The first portion 45a has a flat cylindrical shape and extends in the insertion direction D of the plug 42.

The first portion 45a is made of a metal material and is, for example, a negative terminal (i.e., ground terminal). The first portion 45a forms the outer shape (e.g., outline or surface) of the terminal 45. The second portion 45b is provided inside the first portion 45a (e.g., cylindrical portion). The second portion 45b is, for example, a positive terminal (i.e., signal terminal).

As illustrated in FIG. 8, for example, the USB3.0 micro-B plug 42 includes the terminal 45 thinner than that of the general USB3.0 plug. The strength of the terminal 45 of the plug 42 is less than that of the terminal of the general USB3.0 plug.

Figure 9:
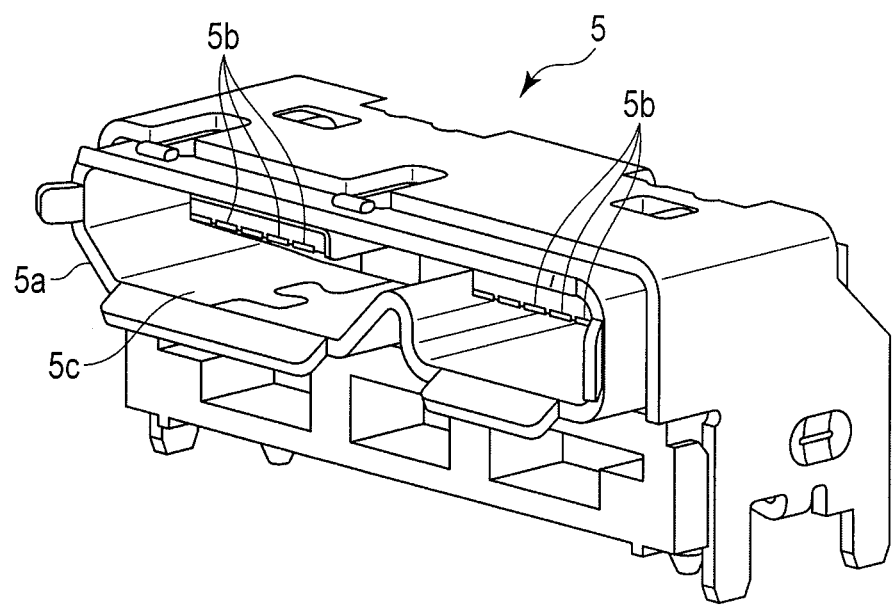
FIG. 9 is an exemplary perspective view illustrating the connector illustrated in FIG. 7.

As illustrated in FIGS. 7 and 9, the connector 5 (i.e., a second connector, a female connector, a female portion, a second connection portion, a second conductive portion, a second member, or a second portion) of the housing 4 is a socket (i.e., jack) into which the plug 42 is fitted (i.e., inserted). In this embodiment, the connector 5 is a standard product (i.e., general-purpose product) and is, for example, a small external I/O connector. In this embodiment, the connector 5 is a USB connector and is, for example, a USB3.0 micro-B connector. When the size of the connector 5 is reduced, the mechanical strength thereof is reduced. The terminal 45 of the plug 42 is inserted (e.g., fitted to, fixed to, connected to, linked to, electrically connected to, conductively connected to, or engaged with) into the connector 5.

The connector 5 includes a first portion 5a (i.e., first terminal) and a plurality of second portions 5b (i.e., second terminals). The first portion 5a has a cylindrical shape and is larger than the terminal 45 of the plug 42. An opening 5c (i.e., recess) into which the terminal 45 of the plug 42 is inserted is provided in the first portion 5a. The first portion 45a of the terminal 45 is inserted into the opening 5c of the first portion 5a of the connector 5 and is fitted (i.e., connected, electrically connected, or conductively connected) to the first portion 5a of the connector 5. The second portion 5b is disposed the inside (e.g., opening 5c) of the first portion 5a (e.g., cylindrical portion). The second portion 5b of the connector 5 is connected (e.g., electrically connected, conductively connected, or fitted) to the second portion 42b of the plug 42.

Figure 10:
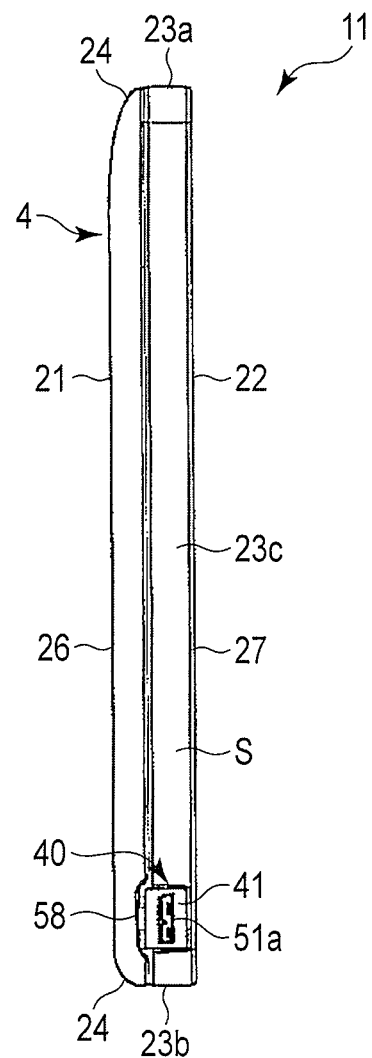
FIG. 10 is an exemplary side view illustrating a first side wall of the electronic apparatus illustrated in FIG. 2.

As illustrated in FIGS. 10 and 11, the recess 41 is provided in the first side wall 23c of the housing 4. The recess 41 is provided in the vicinity of the connector 5. The recess 41 includes an opening 41a which is provided in a surface S (i.e., outer surface) of the housing 4 and is recessed to the inside of the housing 4. The recess 41 is larger than the supporting portion 44 of the plug 42.

Figure 12:
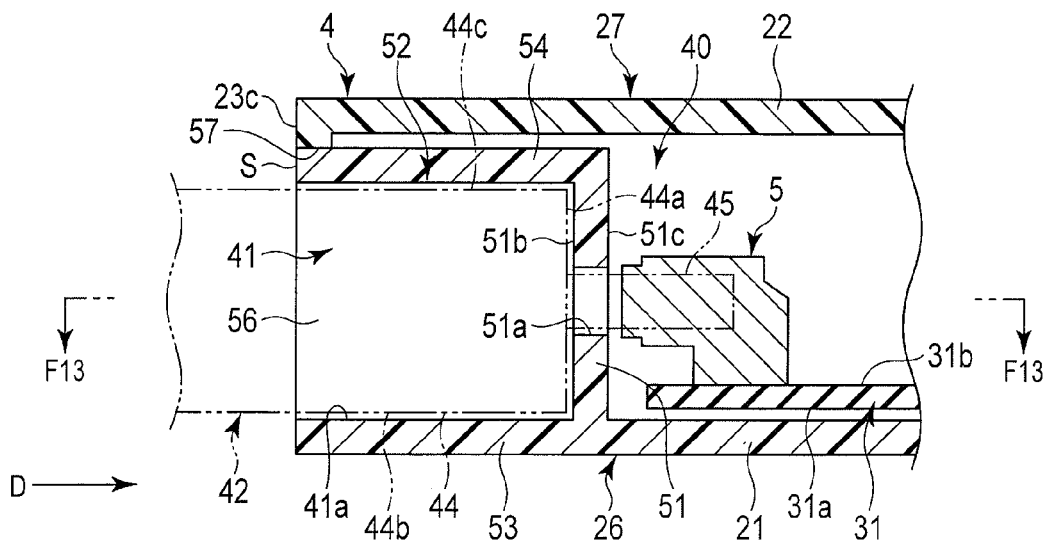
FIG. 12 is an exemplary cross-sectional view illustrating the recess illustrated in FIG. 11.
Figure 13:
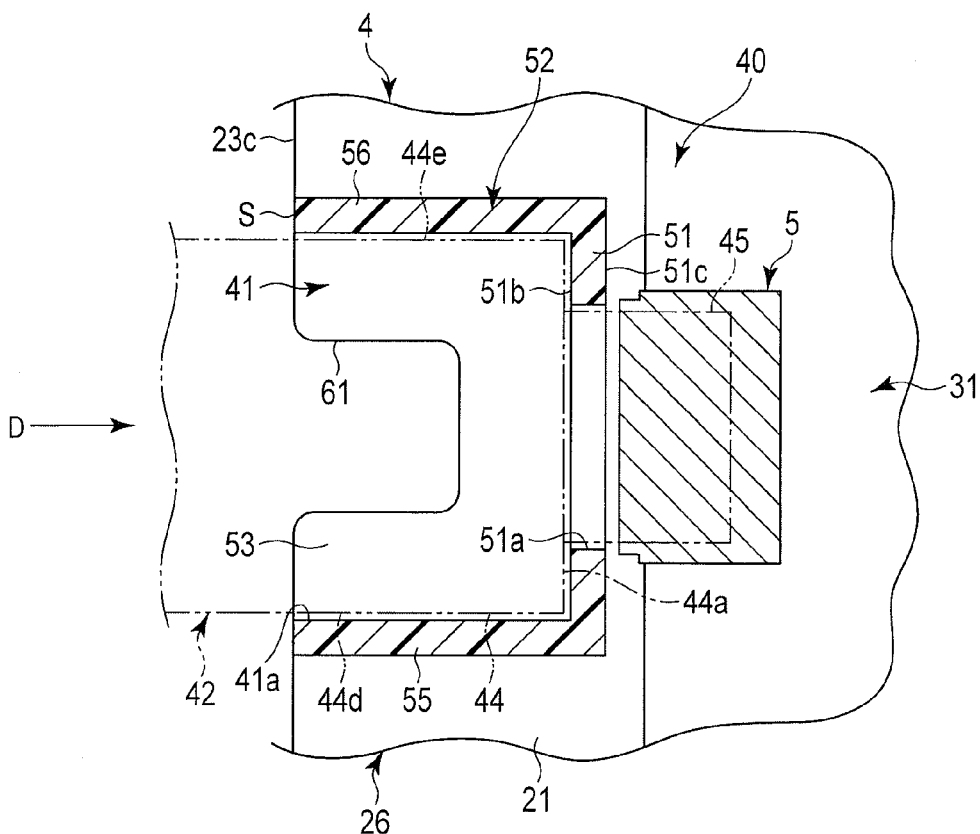
FIG. 13 is an exemplary cross-sectional view illustrating the recess taken along the line F13-F13 illustrated in FIG. 12.

As illustrated in FIGS. 12 and 13, the supporting portion 44 and the terminal 45 of the plug 42 are inserted into the recess 41. The recess 41 includes a first wall 51 (i.e., an end wall, an end surface, a first surface, a bottom wall, a rear wall, or a receiving wall) and an inner circumferential wall 52 (i.e., inner circumferential surface).

Figure 14:
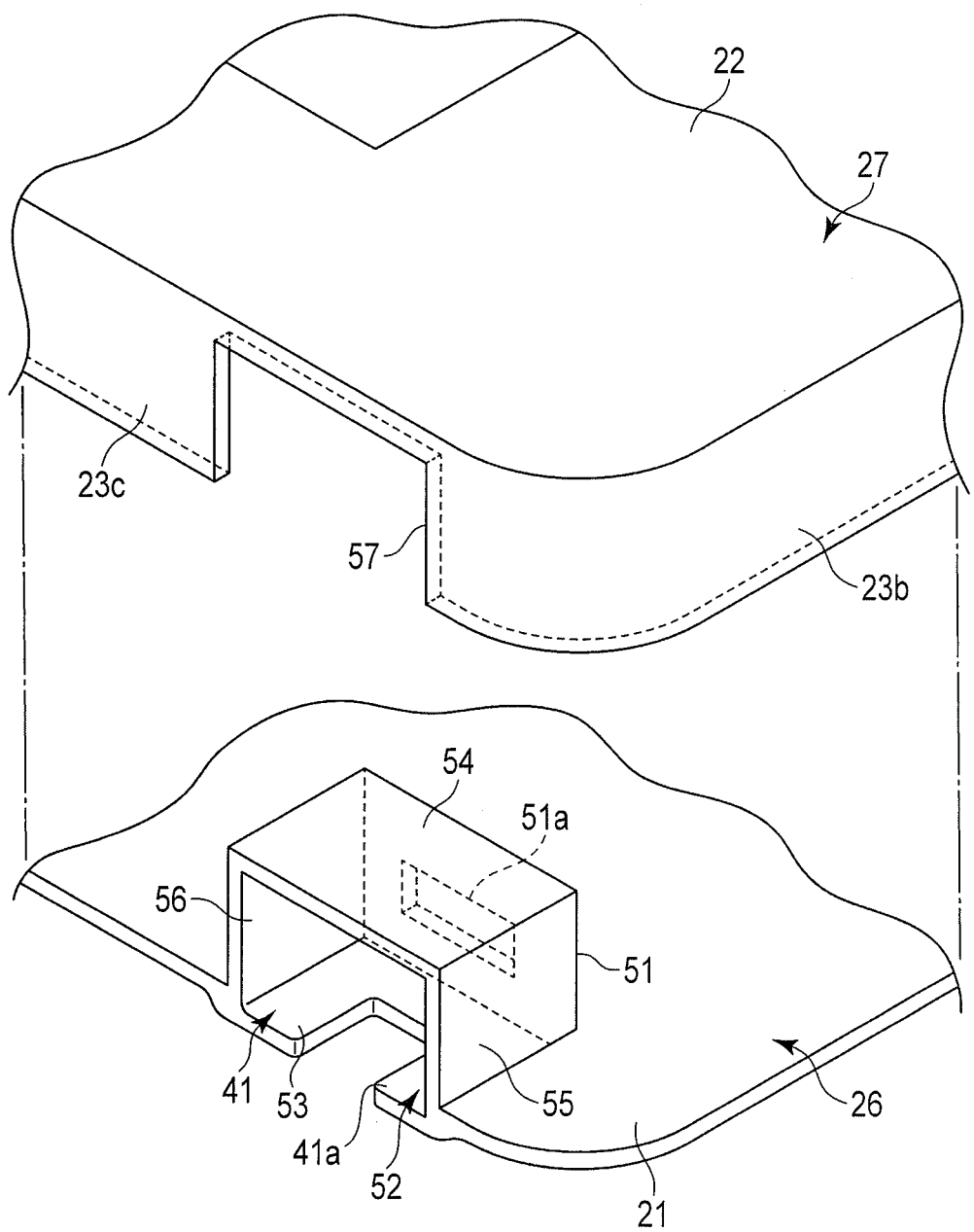
FIG. 14 is an exemplary exploded perspective view illustrating the vicinity of the recess illustrated in FIG. 12.

As illustrated in FIGS. 14 and 15, the first wall 51 is disposed closer to the inside of the housing 4 than the surface S of the housing 4. That is, the first wall 51 is closer to the inside of the housing 4 than the first side wall 23c (i.e., the circumferential wall of the housing 4). The first wall 51 extends in the thickness direction of the housing 4. The first wall 51 extends in a direction intersecting (e.g., substantially perpendicular to) the insertion direction D of the plug 42. The first wall 51 faces the first surface 44a of the supporting portion 44 in the insertion direction D of the plug 42.

The first wall 51 may come into contact with, for example, the first surface 44a of the supporting portion 44. The first wall 51 may support the first surface 44a of the supporting portion 44 and regulate the position of the supporting portion 44. That is, the connection state (e.g., connection depth or fitting depth) between the terminal 45 and the connector 5 may be determined by the contact between the first wall 51 and the supporting portion 44. A gap may be provided between the first wall 51 and the supporting portion 44. The connection state between the terminal 45 and the connector 5 may be determined by the fitting between the terminal 45 and the connector 5.

An opening 51a into which the terminal 45 of the plug 42 is inserted is provided in the first wall 51. The first wall 51 includes an outer surface 51b (i.e., first surface) which is exposed to the outside and an inner surface 51c (i.e., second surface) which is exposed to the inside of the housing 4.

As illustrated in FIGS. 12 and 13, the connector 5 is disposed on the rear side (i.e., back side) of the first wall 51 in the insertion direction D of the plug 42. The connector 5 faces the inner surface 51c of the first wall 51. The connector 5 faces the opening 51a from the inside of the housing 4. The terminal 45 is connected (i.e., fitted, inserted, or electrically connected) to the connector 5 through the opening 51a. In this way, the plug 42 and the connector 5 are electrically connected to each other.

As illustrated in FIGS. 12 and 13, the inner circumferential wall 52 extends from the end (e.g., circumferential end or edge) of the first wall 51 to the outside of the housing 4. The inner circumferential wall 52 extends in the insertion direction D of the plug 42 between the end (e.g., circumferential end or edge) of the first wall 51 and the first side wall 23c of the housing 4. The inner circumferential wall 52 extends between the end (e.g., circumferential end or edge) of the first wall 51 and the surface S of the housing 4.

The inner circumferential wall 52 faces the supporting portion 44 of the plug 42 in a direction intersecting (e.g., substantially perpendicular to) the insertion direction D of the plug 42. The inner circumferential wall 52 surrounds (e.g., circumferential surface or side surface) of the supporting portion 44 and faces the supporting portion 44 in four directions, that is, in the vertical and horizontal directions. The inner surface of the inner circumferential wall 52 defines the opening 41a of the recess 41.

The inner circumferential wall 52 includes a second wall 53 (i.e., a second surface, a first inner surface, or a first surface), a third wall 54 (i.e., a third surface, a second inner surface, or a second surface), a fourth wall 55 (i.e., a fourth surface, a third inner surface, or a third surface), and a fifth wall 56 (i.e., a fifth surface, a fourth inner surface, or a fourth surface). The second to fifth walls 53, 54, 55, and 56 extend in the insertion direction D of the plug 42. The second to fifth walls 53, 54, 55, and 56 are substantially parallel to each other.

The second wall 53 extends from the end of the first wall 51 which is close to the rear wall 21. The second wall 53 forms a portion of the rear wall 21 of the housing 4 (see FIGS. 12 and 14). The second wall 53 faces the second surface 44b of the supporting portion 44. The third wall 54 is opposite to the second wall 53. The third wall 54 faces the third surface 44c of the supporting portion 44. That is, the supporting portion 44 is disposed between the second wall 53 and the third wall 54.

The fourth wall 55 and the fifth wall 56 extend in a direction intersecting (e.g., substantially perpendicular to) the second wall 53 and the third wall 54. The fourth wall 55 and the fifth wall 56 extend in the thickness direction of the housing 4 and reinforce the housing 4.

The fourth wall 55 faces the fourth surface 44d of the supporting portion 44. The fifth wall 56 is opposite to the fourth wall 55. The fifth wall 56 faces the fifth surface 44e of the supporting portion 44. That is, the supporting portion 44 is disposed between the fourth wall 55 and the fifth wall 56.

The inner circumferential wall 52 is a supporting wall which supports the supporting portion 44. In addition, the inner circumferential wall 52 is a guide wall (i.e., guide portion) which guides the supporting portion 44 such that the terminal 45 faces the opening 51a when the plug 42 is inserted into the recess 41. That is, when the plug 42 is inserted into the recess 41 while the supporting portion 44 is moved along the inner circumferential wall 52, the terminal 45 and the opening 51a are positioned relative to each other and the terminal 45 is inserted into the opening 51a.

As illustrated in FIG. 14, the first to fifth walls 51, 53, 54, 55, and 56 are provided integrally with the rear wall 21 (i.e., integrally with the first cover 26). That is, the recess 41 does not have a divided surface. A cutout 57 is provided in the second cover 27 so as to avoid the first to fifth walls 51, 53, 54, 55, and 56.

As illustrated in FIG. 15, as described above, the end of the rear wall 21 includes the curved surface portion 24 which is curved in a direction in which the thickness of the housing 4 is reduced toward the outside of the housing 4. A portion of the end of the housing 4 includes a rising portion 58 (i.e., swollen portion) which rises from the curved surface portion 24 to the outside of the housing 4. The rising portion 58 rises in a direction in which it is separated from the front wall 22. The recess 41 is provided in a region of the circumferential wall 23 which is connected to the rising portion 58. In this way, the thickness of the second wall 53 is ensured.

As described above, the supporting portion 44 of the plug 42 includes the marked portion 46 (i.e., first marked portion). Similarly, a marked portion 59 (i.e., second marked portion) including, for example, marks or characters is provided on the second wall 53 (i.e., rear wall 21) of the housing 4. The marked portion 59 includes, for example, a logo mark indicating the type of connector 5. In this embodiment, the marked portion 59 includes a logo mark indicating a USB connector.

As illustrated in FIGS. 13 to 15, for example, a U-shaped cutout 61 is provided in the second wall 53 (i.e., rear wall 21).

The marked portion 46 of the plug 42 is exposed to the outside through the cutout 61, with the plug 42 fitted to (i.e., connected to or inserted into) the connector 5. That is, the marked portion 46 of the supporting portion 44 is exposed to the outside through the cutout 61 with the supporting portion 44 fitted to (i.e., inserted into) the recess 41. Therefore, even when the plug 42 is inserted into the recess 41, the marked portion 46 of the plug 42 can be seen (i.e., recognized) from the outside.

As illustrated in FIGS. 13 to 15, the cutout 61 is provided in the rear wall 21. That is, the cutout 61 is provided in a region of the inner circumferential wall 52 opposite to the front wall 22. Therefore, the cutout 61 is not seen from the front.

As illustrated in FIGS. 2, 3, and 11, an operative portion 62 is provided on the front wall 22 of the housing 4. An example of the operative portion 62 is a button (e.g., push button) which is pressed in the thickness direction of the housing 4. The operative portion 62 is movably supported by the front wall 22. The operative portion 62 is provided in the vicinity of the recess 41. The operative portion 62 may be provided on the rear wall 21, instead of the front wall 22. As illustrated in FIG. 3, the switch 33 of the circuit board 31 faces the operative portion 62 in the thickness direction of the housing 4. The switch 33 is operated by the operative portion 62.

As illustrated in FIG. 7, a fixing portion of the circuit board 31 includes a first fixing portion 64 and a second fixing portion 65. The first fixing portion 64 and the second fixing portion 65 fix the circuit board 31 to the rear wall 21. The first fixing portion 64 is disposed on a further inner side (i.e., back side) than the connector 5 and the switch 33 in the insertion direction D of the plug 42. That is, the first fixing portion 64 is aligned with the connector 5 and the switch 33 in the insertion direction of the plug 42. The connector 5 and the switch 33 are disposed between the recess 41 and the first fixing portion 64.

The second fixing portion 65 is disposed on the side of the connector 5 in the insertion direction D of the plug 42. That is, the second fixing portion 65 is aligned with the connector 5 in a direction intersecting the insertion direction of the plug 42. The connector 5 is disposed between the second fixing portion 65 and the circumferential wall 23. The first fixing portion 64 and the second fixing portion 65 firmly fix the peripheries of the connector 5 and the switch 33.

Next, the operation of the recess 41 will be described.

In this embodiment, with the plug 42 connected to the connector 5, the inner circumferential wall 52 faces the supporting portion 44 of the plug 42 in the direction intersecting the insertion direction D of the plug 42. Therefore, when stress is applied to the plug 42 in the direction intersecting the insertion direction D of the plug 42 and the plug 42 is inclined with respect to the connector 5, the inner circumferential wall 52 comes into contact with the supporting portion 44 of the plug 42 and supports the supporting portion 44.

In this way, it is possible to suppress the plug 42 from being inclined and thus prevent a large amount of stress from being applied between the plug 42 and the connector 5. Therefore, it is possible to reduce stress applied to the terminal 45 of the plug 42 or stress applied to a connection portion (e.g., soldering portion) between the connector 5 and the circuit board 31.

The inner circumferential wall 52 of the recess 41 extends in the insertion direction D of the plug 42. Therefore, when the plug 42 is inserted into the recess 41, the supporting portion 44 is guided by the inner circumferential wall 52 such that the terminal 45 faces the opening 51a. In this way, the plug 42 is inserted into the recess 41, with the supporting portion 44 coming into contact with the inner circumferential wall 52, and the terminal 45 is inserted into the opening 51a.

According to the above-mentioned structure, it is possible to prevent the occurrence of a defect around the connector 5.

In general, when the plug is inserted into the connector, in some cases, the connector is wrenched. For comparison, a case in which the recess 41 is not provided in the housing is considered. In this case, all stress (e.g., load) is applied between the terminal of the plug and the connector. Therefore, a large amount of stress is applied to the terminal of the plug or the connection portion between the connector and the circuit board. As a result, a defect is likely to occur around the connector 5. For example, the terminal of the plug is damaged or the connection portion between the connector and the circuit board is taken off.

In contrast, in this embodiment, a portion of the housing 4 faces a part of the supporting portion 44 of the plug 42 in the direction intersecting the insertion direction D of the plug 42. According to this structure, for example, when the connector 5 is wrenched, the supporting portion 44 of the plug 42 can be supported by the inner circumferential wall 52. That is, the housing 4 can receive a portion of stress caused by wrenching. That is, it is possible to distribute stress applied between the terminal 45 and the connector 5 to the housing 4. In this way, it is possible to prevent a large amount of stress from being applied to the terminal 45 of the plug 42 or the connection portion between the connector 5 and the circuit board 31. Therefore, it is possible to suppress the occurrence of a defect around the connector 5.

In this embodiment, the housing 4 includes the recess 41 into which the supporting portion 44 of the plug 42 is inserted. When the recess 41 is provided, the supporting portion 44 of the plug 42 is supported in a plurality of directions. Therefore, it is possible to suppress the plug 42 from being inclined and thus suppress stress from being applied to the terminal 45 of the plug 42 or the connection portion between the connector 5 and the circuit board 31.

In this embodiment, the circuit board 31 including the connector 5 is fixed to the rear wall 21. The first wall 51 and the inner circumferential wall 52 of the recess 41 are provided integrally with the rear wall 21. According to this structure, it is possible to reduce the positioning tolerance (e.g., component tolerance) among the plug 42, the connector 5, and the recess 41, as compared to a case in which portions of the first wall 51 and the inner circumferential wall 52 of the recess 41 are provided in the front wall 22. In this way, it is possible to support the plug 42 with high accuracy and further reduce stress. In addition, according to the above-mentioned structure, since the positioning tolerance is small, it is possible to guide the plug 42 to the connector 5 with high accuracy.

In this embodiment, the cutout 61 through which the marked portion 46 of the plug 42 is exposed to the outside of the housing 4 is provided in the inner circumferential wall 52. In this way, even when the plug 42 is inserted into the recess 41, the marked portion 46 of the plug 42 can be seen from the outside. This contributes to improving user convenience.

In this embodiment, the inner circumferential wall 52 includes the wall portions 55 and 56 extending in the thickness direction of the housing 4. In this way, the housing 4 is reinforced by the recess 41 and relatively high rigidity is obtained around the recess 41. In this embodiment, the operative portion 62 is provided in the vicinity of the recess 41. That is, the operative portion 62 is provided in the region reinforced by the recess 41. Therefore, the housing 4 or the operative portion 62 is less likely to be bent when the operative portion 62 is operated and it is easy for the user to operate the operative portion 62. This contributes to improving user convenience.

In this embodiment, the circuit board 31 includes the first fixing portion 64 and the second fixing portion 65 which are fixed to the housing 4. The connector 5 is disposed between the first fixing portion 64 and the recess 41. The second fixing portion 65 is aligned with the connector 5 in the direction intersecting the insertion direction D of the plug 42. According to this structure, the first fixing portion 64 and the second fixing portion 65 firmly fix the periphery of the connector 5.

(Security Lock Attachment Structure)

Next, a security lock attachment structure will be described. As illustrated in FIG. 16, a connector 71 and a security lock attachment portion 6 (i.e., security slot) are provided on the second side wall 23d of the housing 4. The connector 71 is, for example, a power connector.

As illustrated in FIG. 5, the connector 71 is provided in a region (i.e., second region 4b) of the housing 4 which does not overlap the display device 12 in the thickness direction. The connector 71 is disposed between the display device 12 and the circumferential wall 23 (e.g., the lower wall 23b). The connector 71 is electrically connected to the circuit board 31 by a cable 72 (e.g., internal cable).

Figure 17:
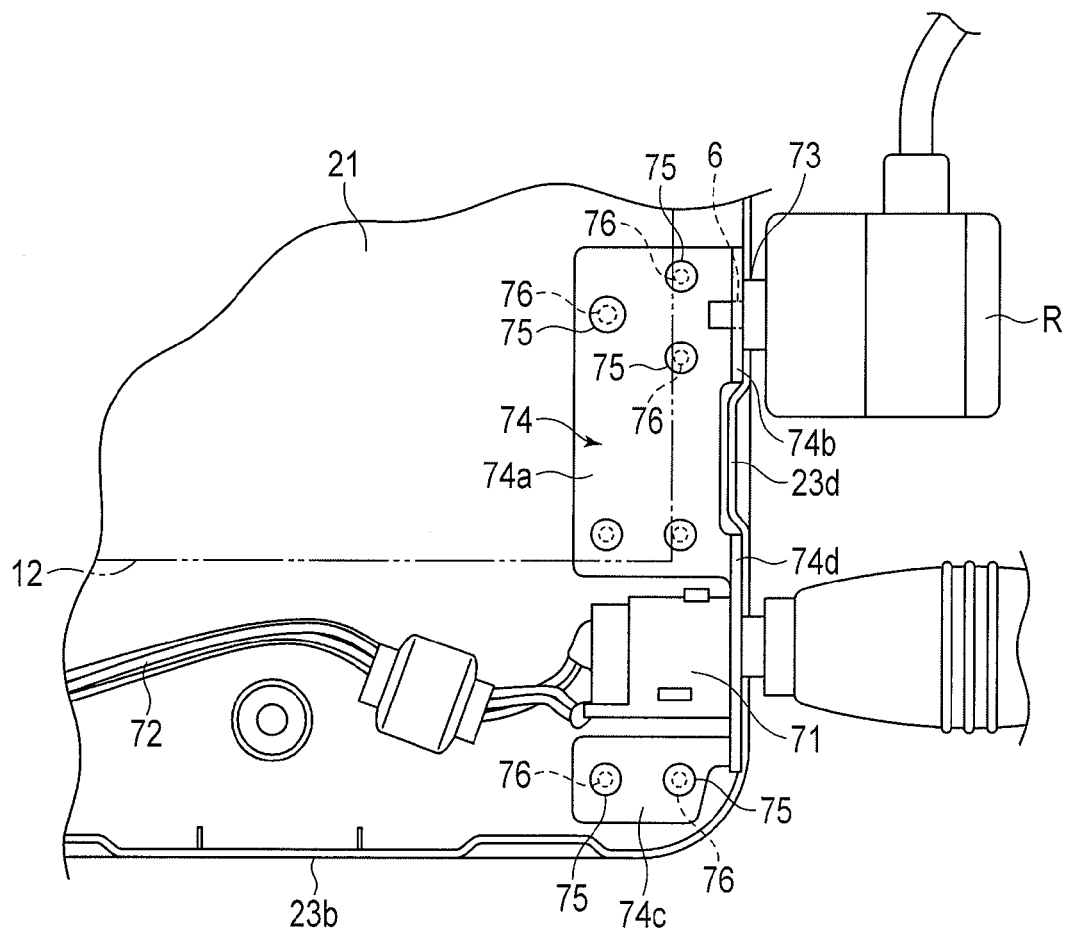
FIG. 17 is an exemplary plan view illustrating the vicinity of a security lock attachment portion illustrated in FIG. 16.

As illustrated in FIGS. 5, 6, and 17, the security lock attachment portion 6 is disposed on the side of the display device 12. The security lock attachment portion 6 is disposed between the display device 12 and the second side wall 23d. An opening 73 through which the security lock attachment portion 6 is exposed is provided in the second side wall 23d.

The security lock attachment portion 6 is an example of an "external connection portion", a "connection portion", an "attachment portion", a "lock supporting portion", or a "holding portion". A security lock R (i.e., a lock, a security member, an external member, or a supporting portion) is to be attached to the security lock attachment portion 6 from the outside. An example of the security lock attachment portion 6 is a hole (i.e., attachment hole or a through hole) to which the security lock R is attached.

As illustrated in FIG. 17, the security lock attachment portion 6 is provided in a fixing member 74 (i.e., a supporting portion, a fixing portion, or an attachment member). The fixing member 74 is accommodated in the housing 4. The fixing member 74 includes a first portion 74a, a second portion 74b, a third portion 74c, and a fourth portion 74d.

The first portion 74a extends substantially in parallel to (i.e., is spread substantially in parallel to) the rear wall 21. The housing 4 includes a plurality of projections 75 (e.g., pins) for welding. For example, the projection 75 protrudes from the rear wall 21 to the inside of the housing 4. The first portion 74a includes a plurality of holes 76 through which the projections 75 pass. After the projections 75 pass through the holes 76 of the first portion 74a, the leading ends of the projections 75 are heated, pressed, and deformed. In this way, the first portion 74a is welded and fixed to the rear wall 21.

As illustrated in FIG. 17, a part of the first portion 74a faces the display device 12. A part of the first portion 74a is disposed between the display device 12 and the rear wall 21. That is, a part of the first portion 74a overlaps the display device 12 in the thickness direction of the housing 4. Since a part of the first portion 74a overlaps the display device 12, it is possible to reduce the size of the housing 4.

The second portion 74b rises from the end of the first portion 74a and extends substantially in parallel to the second side wall 23d. The second portion 74b faces the second side wall 23d. The security lock attachment portion 6 is provided in the second portion 74b.

The third portion 74c is provided at the lower right corner of the housing 4. The third portion 74c is disposed between the power connector 71 and the lower wall 23b. The third portion 74c extends substantially in parallel to (i.e., is spread substantially in parallel to) the rear wall 21. The third portion 74c is welded and fixed to the rear wall 21 in substantially the same way as that in which the first portion 74a is welded and fixed.

The fourth portion 74d rises from the end of the first portion 74a and the end of the third portion 74c. The fourth portion 74d extends substantially in parallel to the second side wall 23d. The fourth portion 74d is provided between the first portion 74a and the third portion 74c and connects the first portion 74a and the third portion 74c. In this way, the first portion 74a is reinforced by the third portion 74c. When the fourth portion 74d extends substantially in parallel to the second side wall 23d, the fourth portion 74d is less likely to be an obstacle in the housing 4.

As illustrated in FIG. 18, the electronic apparatus 11 includes a cover 81 (i.e., a case or a protective portion) which covers the outside of the housing 4 and a cable 43. A plurality of attachment portions 82 (i.e., fixing portions) are provided on the rear wall 21 of the housing 4. An example of the attachment portion 82 is a fastener (e.g., hook-and-loop fastener). Specifically, the cover 81 can be deformed in a first state (e.g., a first form; see FIG. 19) in which it covers the front wall 22 and the rear wall 21 of the housing 4 and a second state (e.g., a second form; see FIG. 20) in which the housing 4 is obliquely supported, with the display screen 13 being exposed.

The cable 43 is, for example, a so-called Y-shaped USB cable having three terminals. One terminal of the cable 43 is the plug 42. The other terminals of the cable 43 are connected to external connection devices, such as a recording device or the like. The electronic apparatus 11 is supplied with power and transmits data through the cable 43.

The cover 81 is made of, for example, synthetic leather or felt cloth. The cover 81 surrounds and protects the housing 4. The cover 81 includes a first portion 91 (i.e., first region), a second portion 92 (i.e., second region), a third portion 93 (i.e., third region), a fourth portion 94 (i.e., fourth region), a fifth portion 95 (i.e., fifth region), and a sixth portion 96 (i.e., sixth region).

Each of the first portion 91 and the second portion 92 can be doubled. The second portion 92 includes a first supporting portion 92a and a second supporting portion 92b which are provided on both sides of a doubled portion. The first portion 91 includes a third supporting portion 91a and a fourth supporting portion 91b which are provided on both sides of a doubled portion.

The first portion 91 has a rectangular shape and is larger than the housing 4. An attachment portion 98 (i.e., fixing portion) is provided in the first portion 91. An example of the attachment portion 98 is a fastener (e.g., hook-and-loop fastener). The attachment portion 98 of the first portion 91 and the attachment portion 82 of the housing 4 are combined with each other to fix the housing 4 to the first portion 91.

Figure 19:
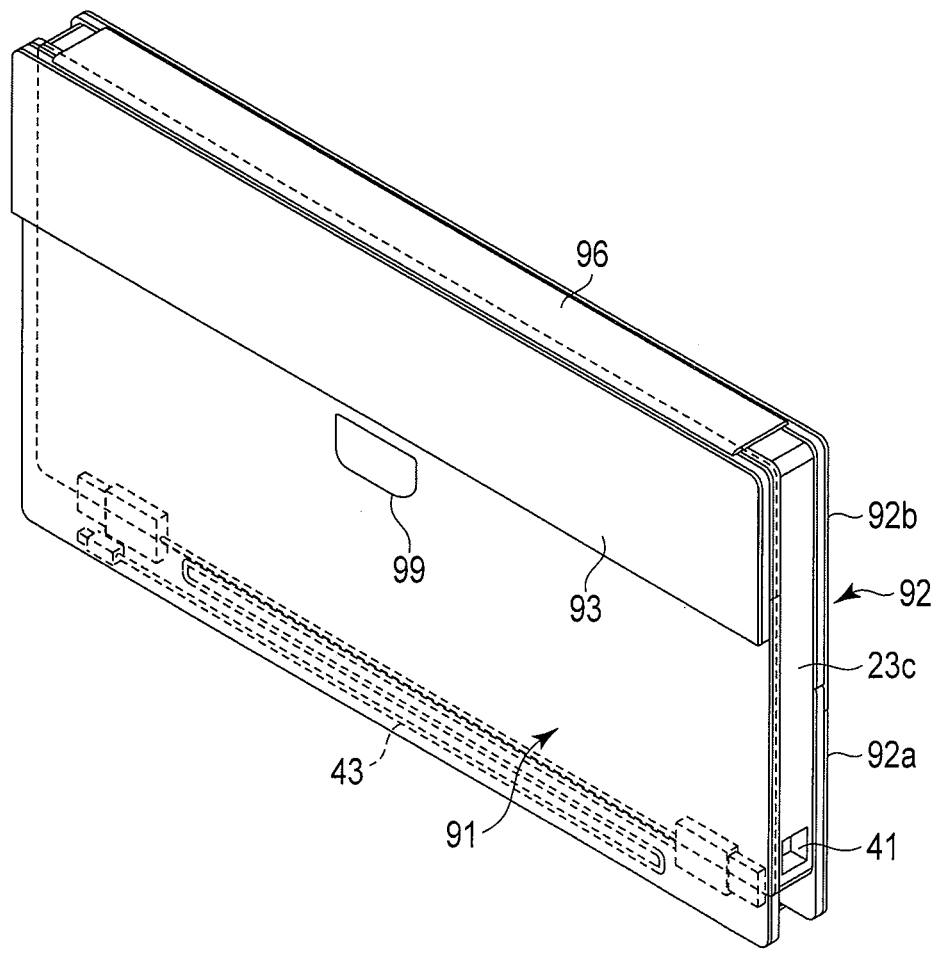
FIG. 19 is an exemplary perspective view illustrating a first state of the cover illustrated in FIG. 18.
Figure 20:
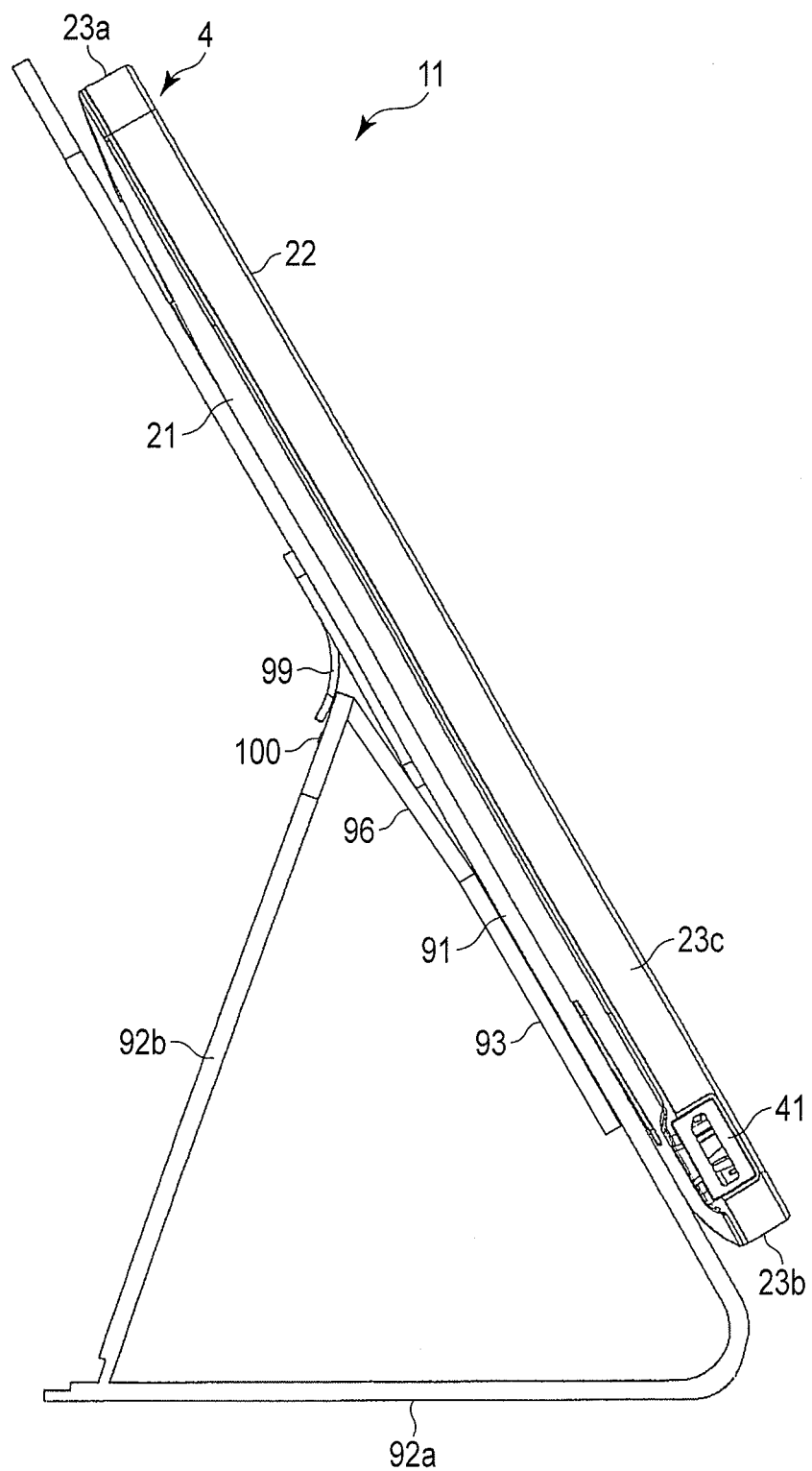
FIG. 20 is an exemplary side view illustrating a second state of the cover illustrated in FIG. 18.

As illustrated in FIG. 19, a supporting portion 99 (i.e., a protruding portion, a projection, or a tongue portion) is provided on the rear surface of the first portion 91. The supporting portion 99 is a tab which is provided on the rear surface of the first portion 91. As illustrated in FIG. 20, in the second state, a portion (e.g., the second supporting portion 92b) of the cover 81 is fitted to the supporting portion 99. In this way, the cover 81 is maintained in the second state.

As illustrated in FIG. 20, a marked portion 100 indicating a region fitted to the supporting portion 99 is provided on the cover 81. The marked portion 100 is, for example, a mark indicating the position where the supporting portion 99 (e.g., tab) is fitted. An example of the marked portion 100 is stitches which are along the outer shape of the supporting portion 99 (e.g., tab) in the second state. When the marked portion 100 is provided, a specific region of the cover 81 is likely to be fitted to the supporting portion 99. This improves user convenience.

As illustrated in FIG. 18, the second portion 92 has a rectangular shape and is larger than the housing 4. The first portion 91 and the second portion 92 have substantially the same size. The first supporting portion 92a is connected to the fourth supporting portion 91b of the first portion 91 through the fifth portion 95 (e.g., first connection portion). The fifth portion 95 is made of, for example, synthetic leather and is flexible. The first supporting portion 92a can be pivoted on the fourth supporting portion 91b of the first portion 91.

The first supporting portion 92a is smaller than the second supporting portion 92b. The first supporting portion 92a and the second supporting portion 92b are aligned with each other through a slit (i.e., an opening, a hole, a recess, a portion, or a region). Specifically, in the first supporting portion 92a and the second supporting portion 92b, rigid members made of felt cloth are disconnected from each other. On the other hand, in the first supporting portion 92a and the second supporting portion 92b, parts made of synthetic leather are connected to each other. Therefore, the first supporting portion 92a and the second supporting portion 92b are connected to each other.

The third portion 93 is connected to the second supporting portion 92b of the second portion 92 through the sixth portion 96 (e.g., second connection portion). The sixth portion 96 is made of, for example, synthetic leather and is flexible. The third portion 93 can be pivoted on the second supporting portion 92b of the second portion 92.

The fourth portion 94 (e.g., holding portion) and the fifth portion 95 are connected to the end of the second portion 92. The fourth portion 94 is made of, for example, felt cloth and is flexible. For example, a hook-and-loop fastener 102 is provided in the fourth portion 94. The fourth portion 94 can be fixed in a rolled state, and covers and holds the cable 43.

As described above, the cover 81 can be deformed between the first state in which it covers and protects the housing 4 and the second state in which the cover 81 is used as a stand of the housing 4. In the first state, the second portion 92 covers the front wall 22 of the housing 4. The housing 4 is disposed between the first portion 91 and the second portion 92. The first side wall 23c and the second side wall 23d of the housing 4 are exposed to the outside. The fourth portion 94 is disposed between the first portion 91 and the second portion 92. The fourth portion 94 can hold the cable 43.

As illustrated in FIG. 21, for example, the cover 81 can be deformed in the second state as follows. First, the second portion 92 is doubled. That is, the second supporting portion 92b is pivoted on the first supporting portion 92a. In addition, the third portion 93 is pivoted on the second supporting portion 92b. Then, as represented by a two-dot chain line in FIG. 21, the first supporting portion 92a, the second supporting portion 92b, and the third portion 93 are arranged in a substantially triangular shape. In this way, the housing 4 is maintained in an inclined state.

In the second state, the rear wall 21 of the housing 4 is covered with the first portion 91 of the cover 81. The first side wall 23c and the second side wall 23d of the housing 4 are exposed to the outside. In this embodiment, the security lock attachment portion 6 is provided on the side wall 23d of the housing 4 and is exposed to the outside in both the first state and the second state.

According to this structure, it is possible to reduce the size of the electronic apparatus 11. That is, since the security lock attachment portion 6 is provided on the side of the display device 12, it is possible to reduce the size of the housing 4.

The position of the security lock attachment portion 6 is not limited to the above. For example, the security lock attachment portion 6 may be provided at the lower end of the second side wall 23d, on the lower wall 23b, or at other positions.

(Third Embodiment)

Figure 22:
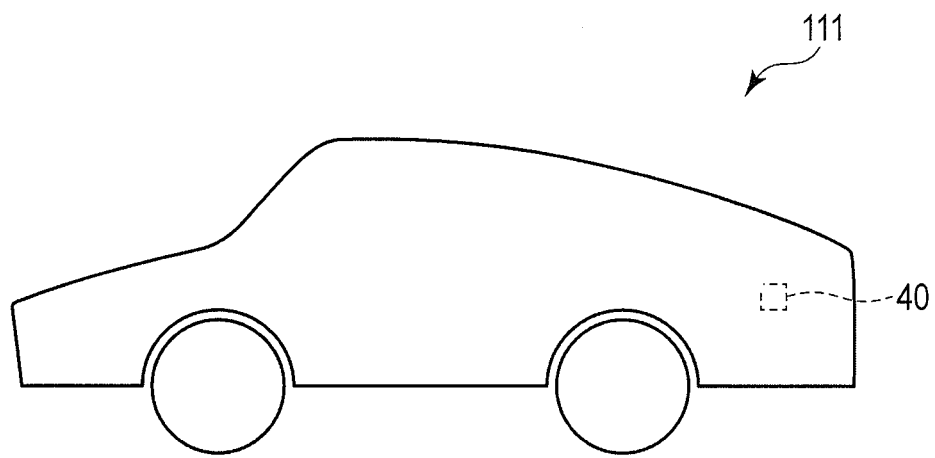
FIG. 22 is an exemplary side view schematically illustrating a vehicle according to a third embodiment.

Next, a vehicle 111 according to a third embodiment will be described with reference to FIG. 22. In the third embodiment, components having the same or similar functions as those in the second embodiment are denoted by the same reference numerals and the description thereof will not be repeated. Structures other than the following structures are the same as those in the second embodiment.

The vehicle 111 is, for example, an electric vehicle and is an example of an "electronic apparatus". The vehicle 111 includes the same connector attachment structure 40 as that in the second embodiment. That is, the vehicle 111 includes a connector 5 and a recess 41. An example of a housing 4 provided with the recess 41 is a body (e.g., vehicle body) of the vehicle 111. The housing 4 is not limited to the body, but may be, for example, a member provided in the body. All of the components according to the second embodiment can be applied to the vehicle 111.

According to this structure, similarly to the second embodiment, it is possible to prevent the occurrence of a defect around the connector.

The invention is not limited to the above-described embodiments, but the components according to the above-described embodiments may be changed without departing from the scope and spirit of the invention. In addition, a plurality of components according to the above-described embodiments may be appropriately combined with each other to form various structures. For example, some of the components according to the above-described embodiments may be removed. Components according to different embodiments may be appropriately combined with each other.

For example, the portion which is provided in the housing 4 and faces the supporting portion 44 from the side is not limited to the recess. For example, a pair of wall portions or a protruding portion may support the supporting portion 44 in the direction intersecting the insertion direction of the plug 42.

In the above-described embodiments, the recess 41 is provided integrally with the rear wall 21. However, the invention is not limited thereto. For example, the recess 41 may include a divided surface and a part of the recess 41 may be provided in the second cover 27. The cutout 61 may be provided in the front wall 22. When the cutout 61 is provided in the rear wall 21, the outward appearance of the front wall 22 can be improved. The connector 5 may be provided in the housing 4 so as to be separated from the circuit board 31.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. An electronic apparatus comprising:
a connector configured to engage a plug, the plug comprising a resin portion and a terminal protruding from an end surface of the resin portion;
a circuit board comprising the connector; and
a housing comprising:
a first wall configured to support the circuit board,
a second wall opposite the first wall, and
a third wall between the first wall and the second wall, the third wall provided with a recess configured to receive the resin portion of the plug,
wherein the recess comprises:
an end wall farther inward from the housing than the third wall, the end wall configured to face the end surface of the resin portion in an insertion direction of the plug, the end wall comprising an opening, the terminal configured to be inserted into the opening; and
an inner circumferential wall between the end wall and the third wall in the insertion direction of the plug, the inner circumferential wall configured to face the resin portion in a direction intersecting the insertion direction of the plug,
the end wall and the inner circumferential wall integral with the first wall, and
the recess provided in an intersection portion between the first wall and the third wall, and the first wall exposed in the recess such that the first wall forms a part of the inner circumferential wall.

2. The electronic apparatus of claim 1,
wherein the inner circumferential wall is configured to guide the resin portion and direct the terminal toward the opening.

3. An electronic apparatus of claim 1, comprising:
a connector configured to engage a plug, the plug comprising a resin portion and a terminal protruding from an end surface of the resin portion;
a circuit board comprising the connector; and
a housing comprising:
a first wall configured to support the circuit board,
a second wall opposite the first wall, and
a third wall between the first wall and the second wall, the third wall provided with a recess configured to receive the resin portion of the plug,
wherein the recess comprises:
an end wall farther inward from the housing than the third wall, the end wall configured to face the end surface of the resin portion in an insertion direction of the plug, the end wall comprising an opening, the terminal configured to be inserted into the opening; and
an inner circumferential wall between the end wall and the third wall in the insertion direction of the plug, the inner circumferential wall configured to face the resin portion in a direction intersecting the insertion direction of the plug, and
the end wall and the inner circumferential wall integral with the first wall,
wherein the resin portion comprises a marked portion, and
the inner circumferential wall comprises a cutout configured to expose the marked portion to an outside of the housing when the resin portion is inserted into the recess.

4. The electronic apparatus of claim 3, further comprising:
a display in the housing,
wherein the second wall comprises an opening configured to expose the display, and
the cutout is located in a region of the inner circumferential wall, the region opposite the second wall.

5. An electronic apparatus comprising:
a connector configured to engage a plug, the plug comprising a resin portion and a terminal protruding from an end surface of the resin portion;
a circuit board comprising the connector; and
a housing comprising:
  a first wall configured to support the circuit board,
  a second wall opposite the first wall, and
  a third wall between the first wall and the second wall, the third wall provided with a recess configured to receive the resin portion of the plug,
wherein the recess comprises:
  an end wall farther inward from the housing than the third wall, the end wall configured to face the end surface of the resin portion in an insertion direction of the plug, the end wall comprising an opening, the terminal configured to be inserted into the opening; and
  an inner circumferential wall between the end wall and the third wall in the insertion direction of the plug, the inner circumferential wall configured to face the resin portion in a direction intersecting the insertion direction of the plug, and
  the end wall and the inner circumferential wall integral with the first wall,
wherein an end of the first wall comprises:
  a curved surface curved in a direction in which the thickness of the housing is reduced and
  a portion swollen from the curved surface toward an outside of the housing, and
the recess is located in a region of the third wall, the region connected to the swollen portion.

6. The electronic apparatus of claim 1,
wherein the inner circumferential wall comprises a wall extending in a thickness direction of the housing, and
an operative portion is located near the recess and configured to be pressed in the thickness direction of the housing.

7. The electronic apparatus of claim 1,
wherein the circuit board comprises a first fixing portion and a second fixing portion fixed to the housing,
the connector is between the first fixing portion and the recess, and
the second fixing portion is aligned with the connector in a direction intersecting the insertion direction of the plug.

8. An electronic apparatus comprising:
a connector configured to engage a plug, the plug comprising a resin portion and a terminal protruding from an end surface of the resin portion; and
a housing comprising:
  the connector,
  a first wall at least partly extending in an insertion direction of the plug,
  a second wall opposite the first wall, and
  a third wall between the first wall and the second wall, the third wall provided with a recess configured to receive the resin portion of the plug,
wherein the recess comprises:
  an end wall farther inward from the housing than the third wall, the end wall configured to face the end surface of the resin portion in the insertion direction of the plug, the end wall comprising an opening, the terminal configured to be inserted into the opening; and
  an inner circumferential wall between the end wall and the third wall, the inner circumferential wall configured to face the resin portion in a direction intersecting the insertion direction of the plug, and
  the recess provided in an intersection portion between the first wall and the third wall, and the first wall exposed in the recess such that the first wall forms a part of the inner circumferential wall.

9. The electronic apparatus of claim 8,
wherein the inner circumferential wall extends in the insertion direction of the plug.

10. The electronic apparatus of claim 1,
wherein the end wall is connected to the first wall in a position separated from the third wall.

11. The electronic apparatus of claim 1,
wherein the housing comprises a first cover and a second cover, the first cover comprising the first wall, the end wall and the circumferential wall, the second cover comprising the second wall and the third wall.

12. The electronic apparatus of claim 8,
wherein the circumferential wall guides the resin part so that the terminal faces the opening.

13. The electronic apparatus of claim 8,
wherein the resin portion comprises a marked portion, and
the inner circumferential wall comprises a cutout configured to expose the marked portion to an outside of the housing when the resin portion is inserted into the recess.

14. The electronic apparatus of claim 13, further comprising a display in the housing,
wherein the second wall comprises an opening configured to expose the display, and
the cutout is located in a region of the inner circumferential wall, the region opposite the second wall.

15. The electronic apparatus of claim 8,
wherein an end of the first wall comprises:
  a curved surface curved in a direction in which the thickness of the housing is reduced and
  a portion swollen from the curved surface toward an outside of the housing, and
  the recess is located in a region of the third wall, the region connected to the swollen portion.

16. The electronic apparatus of claim 8,
wherein the circumferential wall comprises a wall extending in a thickness direction of the housing, and
an operative portion is located near the recess and configured to be pressed in the thickness direction of the housing.

17. The electronic apparatus of claim 8,
wherein the end wall is connected to the first wall in a position separated from the third wall.

18. The electronic apparatus of claim 8,
wherein the housing comprises a first cover and a second cover, the first cover comprising the first wall, the end wall and the circumferential wall, and the second cover comprising the second wall and the third wall.

* * * * *